US009123743B2

(12) United States Patent
Lin et al.

(10) Patent No.: US 9,123,743 B2
(45) Date of Patent: Sep. 1, 2015

(54) FINFETS AND METHODS FOR FORMING THE SAME

(71) Applicant: Taiwan Semiconductor Manufacturing Company, Ltd., Hsin-Chu (TW)

(72) Inventors: Yu-Chao Lin, Hsin-Chu (TW); Tzu-Yen Hsieh, Taipei (TW); Ming-Chia Tai, Zhubei (TW); Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 169 days.

(21) Appl. No.: 13/790,742

(22) Filed: Mar. 8, 2013

(65) Prior Publication Data

US 2014/0256094 A1    Sep. 11, 2014

(51) Int. Cl.
*H01L 29/66* (2006.01)

(52) U.S. Cl.
CPC .... *H01L 29/66545* (2013.01); *H01L 29/66795* (2013.01)

(58) Field of Classification Search
CPC ................................ H01L 29/66545
See application file for complete search history.

(56) References Cited

U.S. PATENT DOCUMENTS

| 2005/0093035 | A1* | 5/2005 | Yagishita et al. | 257/288 |
|---|---|---|---|---|
| 2006/0006478 | A1* | 1/2006 | Kanegae et al. | 257/382 |
| 2012/0248509 | A1* | 10/2012 | Guo et al. | 257/288 |
| 2014/0084383 | A1* | 3/2014 | Cai et al. | 257/401 |

* cited by examiner

*Primary Examiner* — Angel Roman
(74) *Attorney, Agent, or Firm* — Slater & Matsil, L.L.P.

(57) ABSTRACT

Methods for forming a semiconductor device and a FinFET device are disclosed. A method comprises forming a dummy gate electrode layer over a substrate, the dummy gate electrode layer having a first height, forming a first etch stop layer on the dummy gate electrode layer, forming a first hard mask layer on the first etch stop layer, and patterning the first hard mask layer. The method further comprises patterning the first etch stop layer to align with the patterned first hard mask layer, and patterning the gate electrode layer to form a dummy gate electrode, the dummy gate electrode aligning with the patterned first etch stop layer, wherein after the patterning the gate electrode layer the first hard mask layer has a vertical sidewall of a second height, the second height being less than the first height, and the first hard mask layer having a rounded top surface.

20 Claims, 7 Drawing Sheets

FINFETS AND METHODS FOR FORMING THE SAME

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (FinFETs) have been studied to overcome some of these problems.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Fin Field-Effect Transistors (FinFETs) and methods of forming the same are provided in accordance with various embodiments. The intermediate stages of forming the FinFETs are illustrated. Some variations of the embodiments are discussed. Throughout the various views and illustrative embodiments, like reference numbers are used to designate like elements. Although method embodiments are discussed in a particular order, various other method embodiments may be performed in any logical order and may include fewer or more steps described herein.

Figure 1:
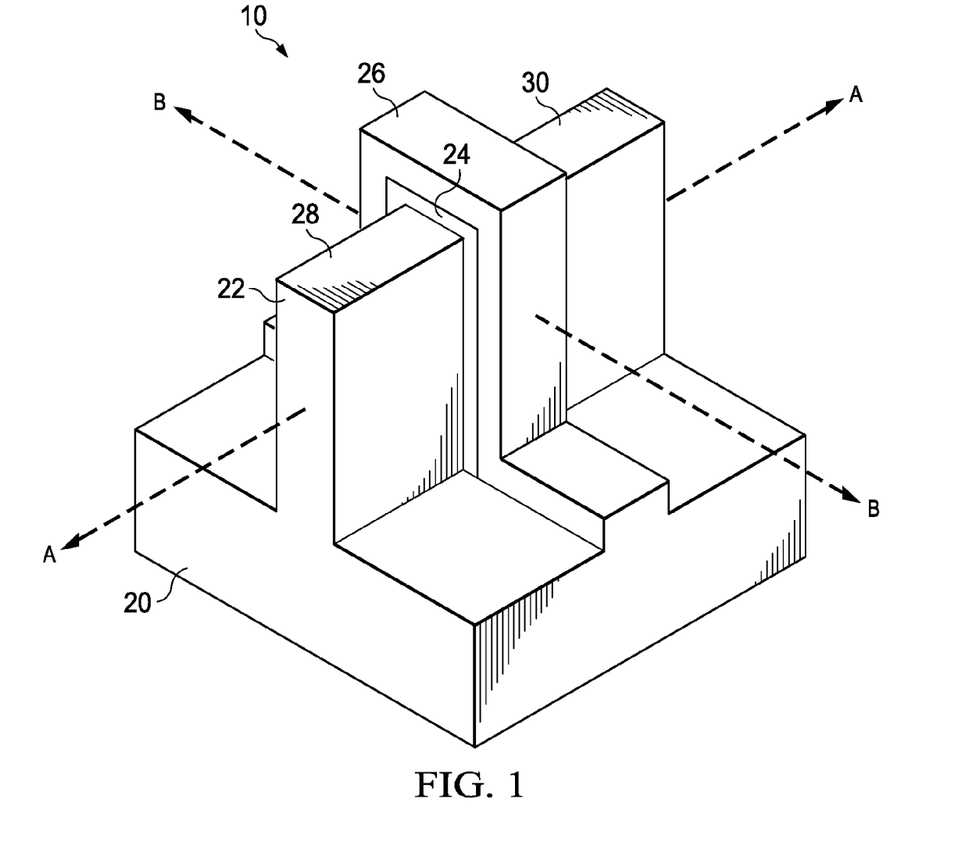
FIG. 1 is an example of a fin field-effect transistor (FinFET) in a three-dimensional view.

FIG. 1 illustrates an example of a FinFET 10 in a three-dimensional view. The FinFET 10 comprises a fin 22 on a substrate 20. A gate dielectric 24 is along sidewalls and over a top surface of the fin 22, and a gate electrode 26 is over the gate dielectric 24. Source/drain regions 28 and 30 are disposed in opposite sides of the fin 22 with respect to the gate dielectric 24 and gate electrode 26. FIG. 1 further illustrates reference cross-sections that are used in later figures. Cross-section A-A is along a longitudinal axis of the fin 22 and in a direction of, for example, a current flow between the source/drain regions 28 and 30. Cross-section B-B is perpendicular to cross-section A-A and is across a channel, gate dielectric 24, and gate electrode 26 of the FinFET 10.

Figure 11A:
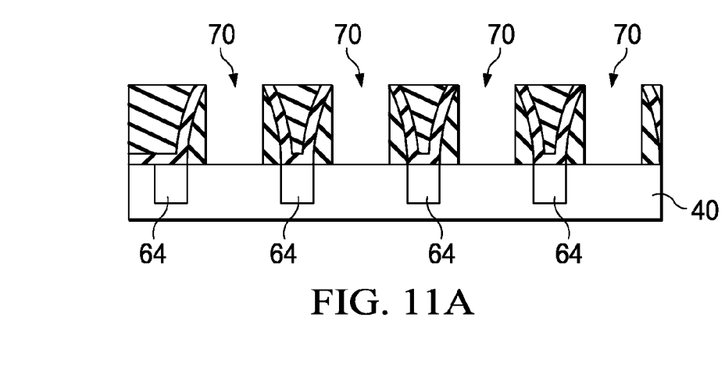
Figure 11B:
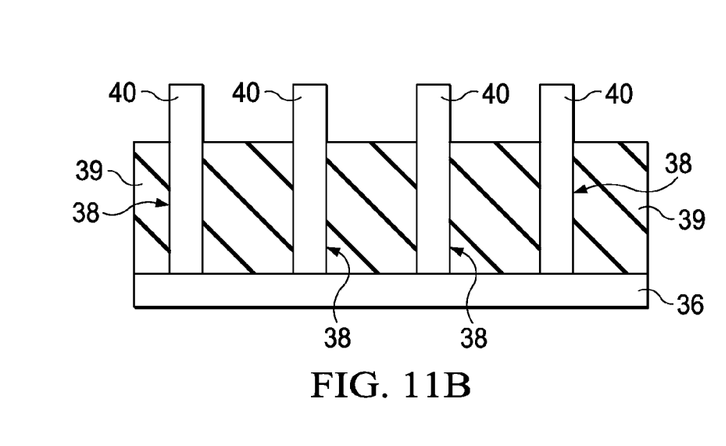
Figure 12A:
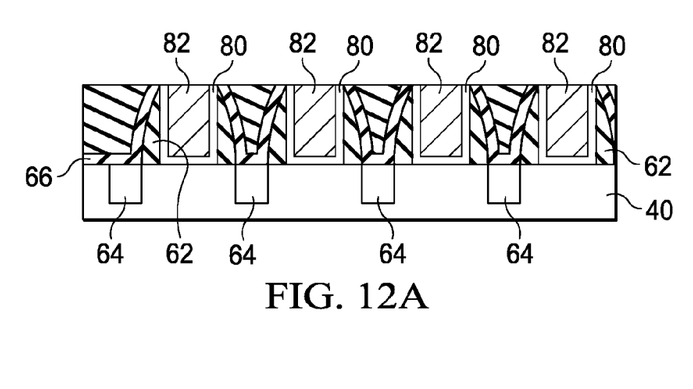
Figure 12B:
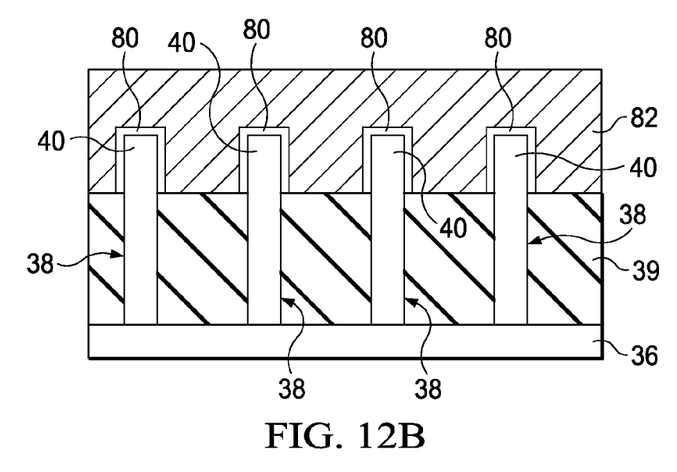
Figure 13:
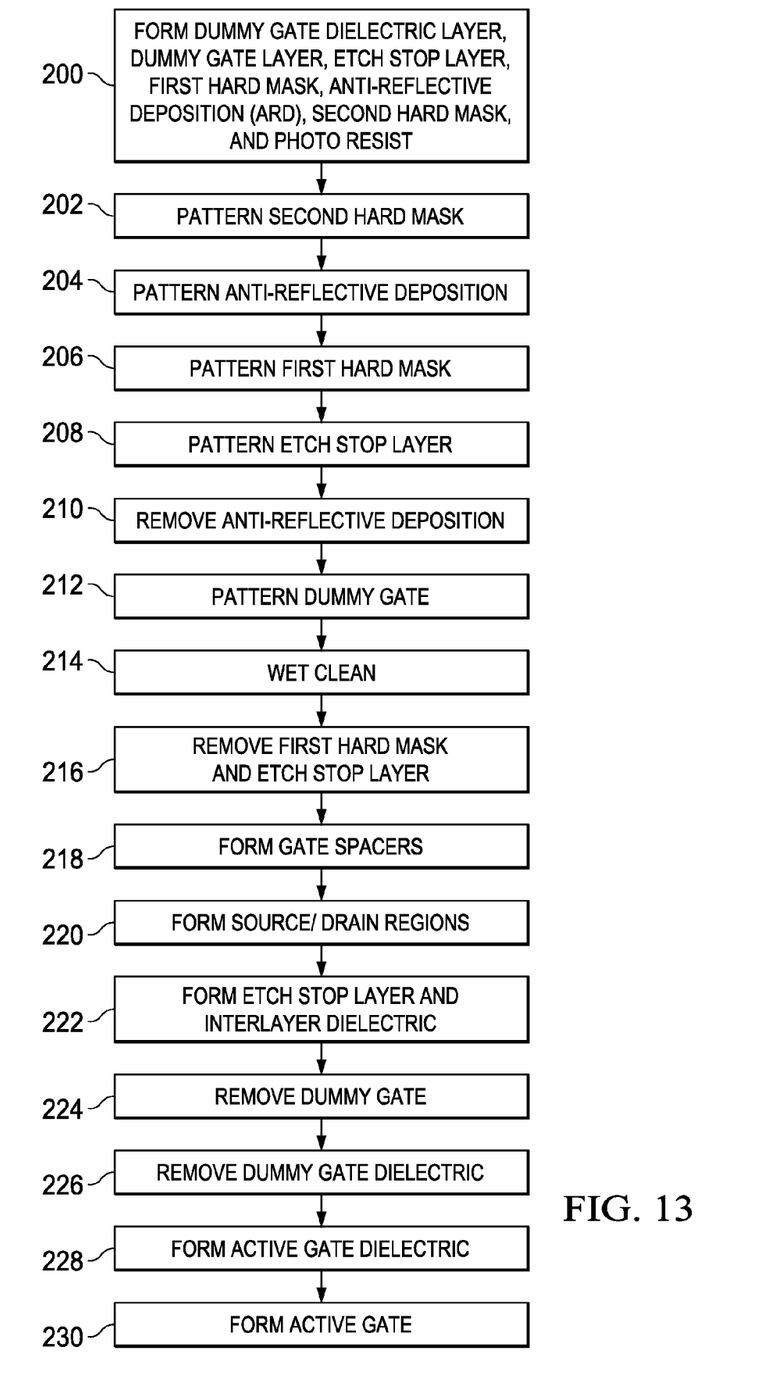
FIG. 13 is a process flow of the process shown in FIGS. 2 through 12B in accordance with an embodiment.

FIGS. 2 through 12B are cross-sectional views of intermediate stages in the manufacturing of a FinFET in accordance with an embodiment, and FIG. 13 is a process flow of the process shown in FIGS. 2 through 12B. FIGS. 2 through 8 illustrate cross-section B-B illustrated in FIG. 1, except for multiple FinFETs (see FIGS. 9A through 12B with four semiconductor fins 40 and each semiconductor fin 40 having four gate electrodes over it). In FIGS. 9A through 12B, figures ending with an "A" designation are illustrated along a similar cross-section A-A, and figures ending with a "B" designation are illustrated along a similar cross-section B-B.

Figure 2:
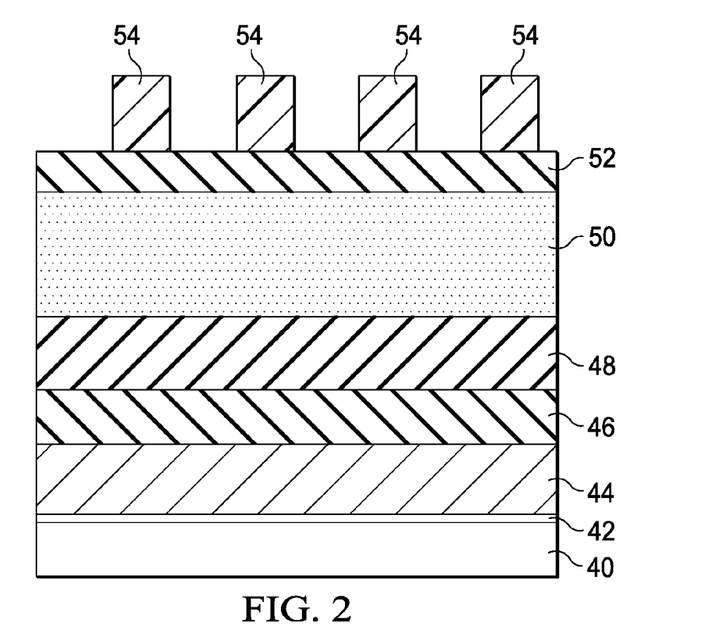
FIGS. 2, 3, 4, 5, 6, 7, 8, 9A, 9B, 10A, 10B, 11A, 11B, 12A, and 12B are cross-sectional views of intermediate stages in the manufacturing of a FinFET in accordance with an embodiment.

FIG. 2 illustrates a substrate 40, which may be a part of a wafer. Substrate 40 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 40 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 40 may be doped with a p-type dopant, such as boron, aluminum, gallium, or the like, although the substrate may alternatively be doped with an n-type dopant, as is known in the art.

The substrate 40 may include active devices (not shown in FIG. 2). As one of ordinary skill in the art will recognize, a wide variety of devices such as transistors, capacitors, resistors, combinations of these, and the like may be used to generate the structural and functional requirements of the design for the FinFET. The devices may be formed using any suitable methods. Only a portion of the substrate 40 is illustrated in the figures, as this is sufficient to fully describe the illustrative embodiments. In an exemplary embodiment the substrate 40 may be a semiconductor fin (see FIGS. 1 and 10A through 12B), and is referred to as semiconductor fin 40 hereinafter. In this embodiment, semiconductor fins may be formed to extend from a substrate.

A dummy gate dielectric layer 42, a dummy gate electrode layer 44, an etch stop layer (ESL) 46, a first hard mask layer 48, an anti-reflective deposition (ARD) layer 50, a second hard mask layer 52, and a photoresist 54 are formed (step 200) over the semiconductor fin 40. The dummy gate dielectric layer 42 may be formed over the semiconductor fin 40 by thermal oxidation, chemical vapor deposition (CVD), a spin-on-glass process, sputtering, or any other methods known and used in the art for forming a dummy gate dielectric. In some embodiments, the dummy gate dielectric layer 42 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the dummy gate dielectric layer 42 includes dielectric materials having a high dielectric constant (k value), for example, greater than about 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The dummy gate electrode layer 44 may be formed over the dummy gate dielectric layer 42. The dummy gate electrode layer 44 may comprise a conductive material and may be selected from a group comprising polycrystalline-silicon (poly-Si), poly-crystalline silicon-germanium (poly-SiGe), metallic nitrides, metallic silicides, metallic oxides, and metals. The dummy gate electrode layer 44 may be deposited by CVD, sputter deposition, or other techniques known and used in the art for depositing conductive materials. The top surface of the dummy gate electrode layer 44 usually has a non-planar top surface and may be planarized after it is deposited. In an embodiment, the dummy gate electrode layer 44 may be formed to have a thickness from about 50 nm to about 100 nm.

The ESL 46 may be deposited over the dummy gate dielectric layer 44. The ESL 46 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The ESL 46 may be deposited through a process such as CVD, or a spin-on-glass process, although any acceptable process may be utilized to form the ESL 46 to a thickness between about 20 Å to about 80 Å. In an embodiment, the ESL 46 may be used as an etch stop layer and/or a chemical mechanical polish (CMP) stop layer for subsequent processes.

The first hard mask layer 48 may be formed over the ESL 46. The first hard mask layer 48 may be a masking material such as silicon oxide, silicon nitride, the like, or a combination thereof and may be formed using a process such as CVD. However, any other suitable hard mask material, such as poly-silicon, and any other process of formation, such as plasma enhanced CVD (PECVD), may alternatively be utilized. In an embodiment the first hard mask layer 48 may be formed to a thickness of between about 500 Å and about 1000 Å.

The ARD layer 50 may be formed over the first hard mask layer 48 and may be utilized for critical dimension control in order to obtain and control the desired dimensions of the patterning of the first hard mask layer 48 (not shown in FIG. 2 but illustrated and discussed below with respect to FIG. 5). In an embodiment the ARD layer 50 may comprise amorphous carbon formed by a CVD process, although other suitable materials and methods of formation may alternatively be utilized. The ARD layer 50 may be formed to a thickness of between about 700 Å and about 1500 Å.

The second hard mask layer 52 may be a hard mask utilized to help pattern the ARD layer 50, and may be a masking material such as silicon oxynitride (SiON), although other suitable materials, such as silicon oxide or silicon nitride, may alternatively be utilized, and may be formed a process such as CVD. However, any other suitable processes and thicknesses may alternatively be utilized. In an embodiment the second hard mask layer 52 may be formed to a thickness of between about 150 Å and about 300 Å.

A photoresist 54 may be deposited and patterned over the second hard mask layer 52. Although FIG. 2 illustrates four separate sections of the first photoresist 54, there may be more or less sections depending on the number of dummy gate electrodes 60 (see FIG. 9A) that are desired. The photoresist 54 may comprise a conventional photoresist material, such as a deep ultra-violet (DUV) photoresist, and may be deposited on the surface of the second hard mask layer 52, for example, by using a spin-on process to place the photoresist 54. However, any other suitable material or method of forming or placing the photoresist 54 may alternatively be utilized. Once the photoresist 54 has been placed on second hard mask layer 52, the photoresist 54 may be exposed to energy, e.g. light, through a patterned reticle in order to induce a reaction in those portions of the photoresist 54 exposed to the energy. The photoresist 54 may then be developed, and portions of the photoresist 54 may be removed, exposing a surface of the second hard mask layer 52.

Figure 3:
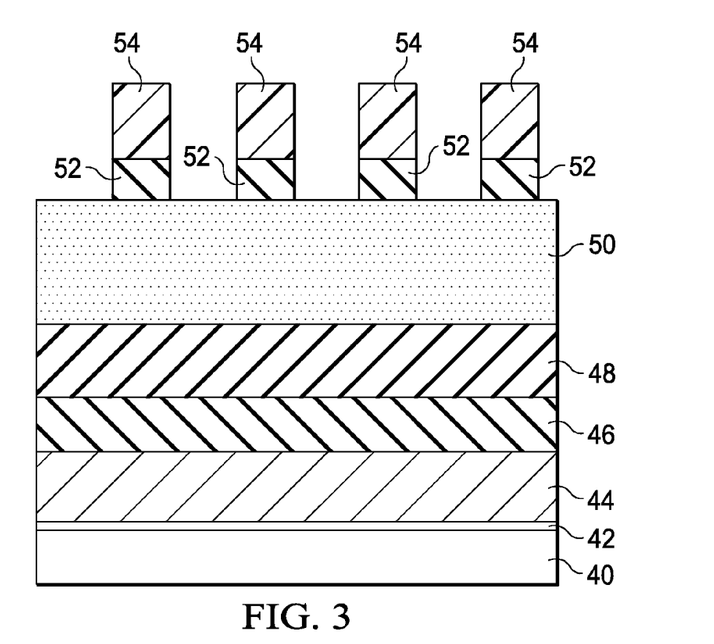

After developing and removing a portion of the photoresist 54, an etch step is further performed into the second hard mask layer 52 to remove the exposed portions, thereby patterning the second hard mask layer 52 (step 202) as illustrated in FIG. 3. The second hard mask layer 52 may be patterned by a dry chemical etch with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like. In an embodiment, the process for patterning the second hard mask layer 52 is performing a plasma etch at a pressure in a range from about 3 mTorr to about 10 mTorr, at a power in a range from about 300 watts to about 1000 watts, with an etching bias in range from about 50 volts to about 500 volts, with a plasma flow including from about 10 standard cubic centimeters per minute (sccm) to about 100 sccm of $CF_4$, and about 10 sccm to about 50 sccm of $CH_2F_2$.

Figure 4:
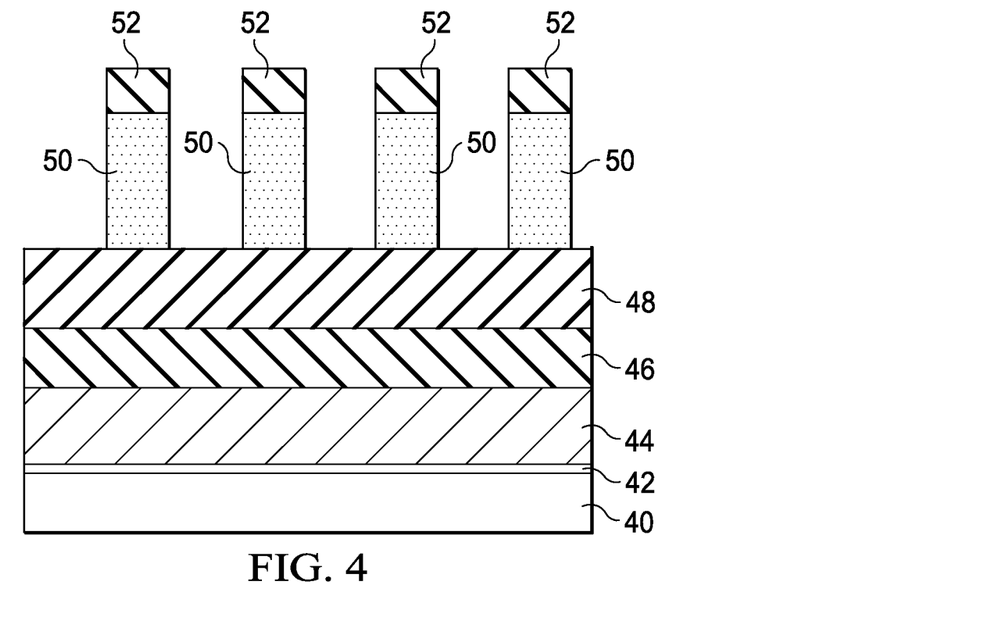

After the second hard mask layer 52 has been patterned, the pattern may be transferred from the second hard mask layer 52 to the ARD layer 50 (step 204) as illustrated in FIG. 4. In some embodiments, the patterning may be performed by a dry, anisotropic etch. The ARD layer 50 may be patterned by a dry chemical etch with a plasma source and an etchant gas. The plasma source may be an ICP etch, a TCP etch, an ECR etch, an RIE, or the like. In an embodiment, the process for patterning the ARD layer 50 is performing a plasma etch at a pressure in a range from about 5 mTorr to about 10 mTorr, at a power in a range from about 500 watts to about 1500 watts, with an etching bias in range from about 50 volts to about 400 volts, with a plasma flow including from about 50 sccm to about 200 sccm of $SO_2$, about 50 sccm to about 300 sccm of $O_2$, and about 100 sccm to about 500 sccm of He.

Figure 5:
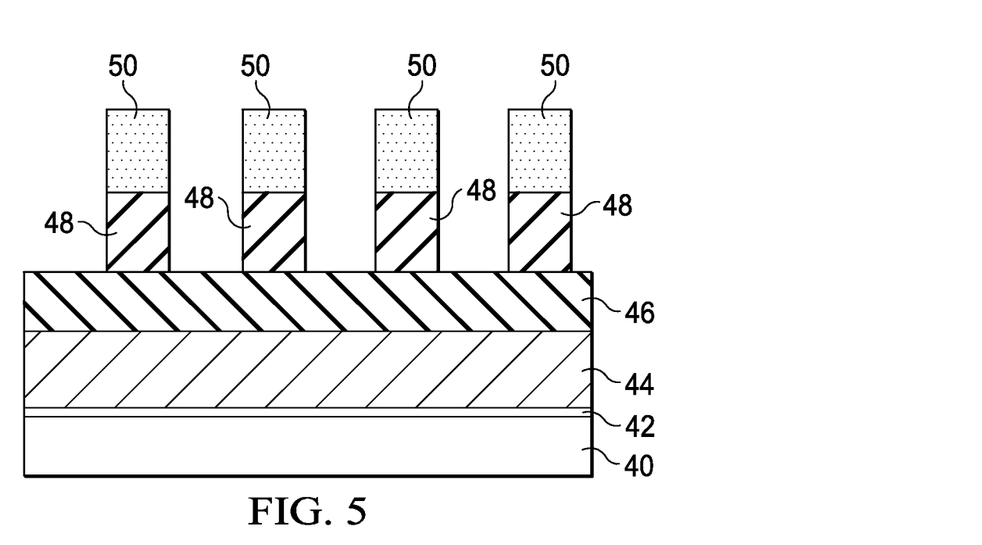

After the ARD layer 50 has been patterned, the pattern may be transferred from the ARD layer 50 to the first hard mask layer 48 (step 206) as illustrated in FIG. 5. In some embodiments, the patterning may be performed by a dry, anisotropic etch. The first hard mask layer 48 may be patterned by a dry chemical etch with a plasma source and an etchant gas. The plasma source may be an ICP etch, a TCP etch, an ECR etch, an RIE, or the like. In an embodiment, the process for patterning the first hard mask layer 48 is performing a plasma etch at a pressure in a range from about 3 mTorr to about 10 mTorr, at a power in a range from about 300 watts to about 800 watts, with an etching bias in range from about 200 volts to about 700 volts, with a plasma flow including from about 50 sccm to about 200 sccm of $CF_4$, about 50 sccm to about 200 sccm of $CHF_3$, and about 100 sccm to about 400 sccm of Ar.

Figure 6:
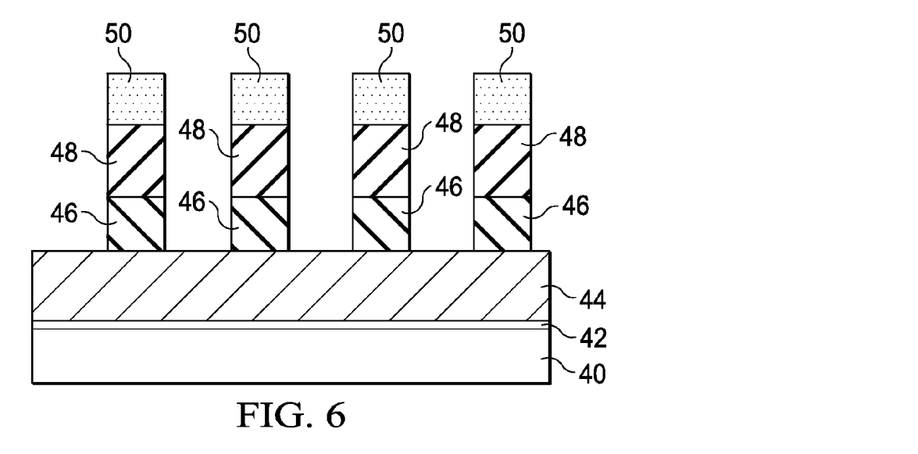

After the first hard mask layer 48 has been patterned, the pattern may be transferred from the first hard mask layer 48 to the ESL 46 (step 208) as illustrated in FIG. 6. In some embodiments, the patterning may be performed by a dry, anisotropic etch. The ESL 46 may be patterned by a dry chemical etch with a plasma source and an etchant gas. The plasma source may be an ICP etch, a TCP etch, an ECR etch, an RIE, or the like. In an embodiment, the process for patterning the ESL 46 is performing a plasma etch at a pressure in a range from about 5 mTorr to about 15 mTorr, at a power in a range from about 500 watts to about 1500 watts, with an etching bias in range from about 200 volts to about 600 volts, with a plasma flow including from about 10 sccm to about 50 sccm of $CF_4$, about 50 sccm to about 200 sccm of $CH_2F_2$/$CH_2F_3$, and about 3 sccm to about 20 sccm of $O_2$.

Figure 7:
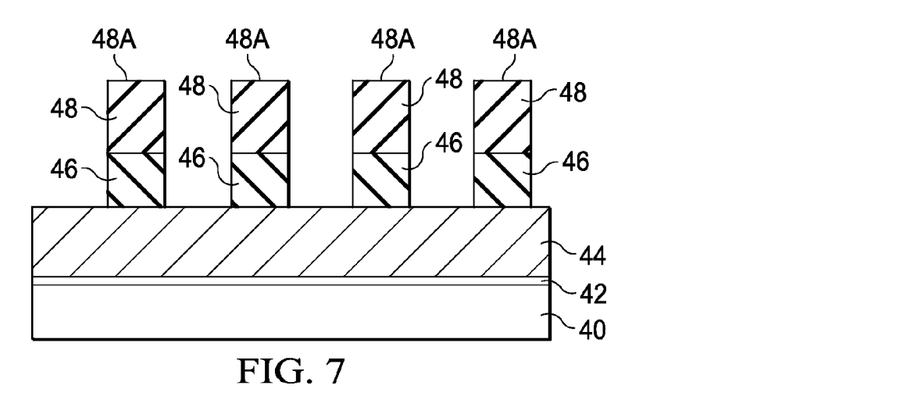

After the ESL 46 has been patterned, the patterned ARD layer 50 may be removed exposing top surfaces 48A of the first hard mask layer 48 (step 210) as illustrated in FIG. 7. In some embodiments, the ARD layer 50 removal process may be performed without exposure to an external environment (also referred to as "in-situ") between the patterning of the ESL 46 and the ARD layer 50 removal to prevent defects from forming on the patterned first hard mask layer 48 and the patterned ESL 46. The ARD layer 50 may be removed by a dry chemical etch with a plasma source and an etchant gas. The plasma source may be an ICP etch, a TCP etch, an ECR etch, an RIE, or the like. In an embodiment, the process for removing the ARD layer 50 is performing a plasma etch at a pressure in a range from about 5 mTorr to about 15 mTorr, at a power in a range from about 300 watts to about 1000 watts, with an etching bias in range from about 40 volts to about 200 volts, with a plasma flow including from about 50 sccm to about 500 sccm of $O_2$.

Figure 8:
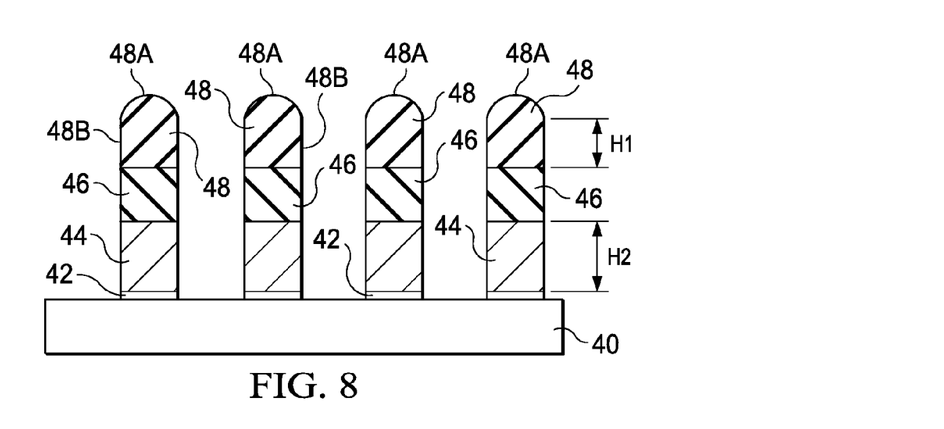

After the patterned ARD layer 50 has been removed, the pattern may be transferred from the first hard mask layer 48 and the ESL 46 to the dummy gate electrode layer 44 and the dummy gate dielectric layer 42 (step 212) as illustrated in FIG. 8. In some embodiments, the dummy gate electrode layer 44 and the dummy gate dielectric layer 42 patterning process may be performed without exposure to an external environment ("in-situ") between the removal of the ARD layer 50 and the patterning of the dummy gate electrode layer 44 and the dummy gate dielectric layer 42 prevent defects from forming on the patterned first hard mask layer 48, the patterned ESL 46, the patterned dummy gate electrode layer 44, and the patterned dummy gate dielectric layer 42. The dummy gate electrode layer 44 and the dummy gate dielectric layer 42 may be patterned by a dry chemical etch with a plasma source and an etchant gas. The plasma source may be an ICP etch, a TCP etch, an ECR etch, an RIE, or the like. In an embodiment, the process for patterning the dummy gate electrode layer 44 is performing a plasma etch at a pressure in a range from about 2 mTorr to about 5 mTorr, at a power in a range from about 300 watts to about 800 watts, with an etching bias in range from about 50 volts to about 150 volts, with a plasma flow including from about 20 sccm to about 200 sccm of HBr, and about 2 sccm to about 10 sccm of $O_2$. In some embodiments, the etch process to pattern the dummy gate electrode layer 44 and the dummy gate dielectric layer 42 may comprise an etch process being performed with an additional over-etch of about 10% to about 50% of the normal etching time span.

As illustrated in FIG. 8, after the patterning of the dummy gate electrode layer 44 and the dummy gate dielectric layer 42, the patterned first hard mask layer 48 has a vertical sidewall 48B (meaning that sidewall 48B is substantially orthogonal to the top surface of the semiconductor fin 40) with a height H1 from about 25% to about 50% of the height H2 of the dummy gate electrode 60. In some embodiments, the height H1 of the vertical sidewall of the patterned first hard mask layer 48 is from about 200 Å to about 400 Å and has a rounded top surface 48A. This vertical sidewall 48B with the height H1 in the aforementioned range provides an etching margin to produce a dummy gate electrode 60 (see FIG. 9A) with a square top profile rather than a dummy gate electrode with a rounded top profile as caused by a hard mask without enough etching margin.

After the patterning of the dummy gate electrode layer 44 and the dummy gate dielectric layer 42, a wet clean process may be performed (step 214) on that patterned first hard mask layer 48, the patterned ESL 46, the patterned dummy gate electrode layer 44, and the patterned dummy gate dielectric layer 42. In an embodiment, the wet clean process may comprise a diluted hydrofluoric acid (DHF) treatment, an ammonium peroxide mixture (APM), a sulfuric peroxide mixture (SPM), hot deionized water (DI water), the like, or a combination thereof.

Figure 9A:
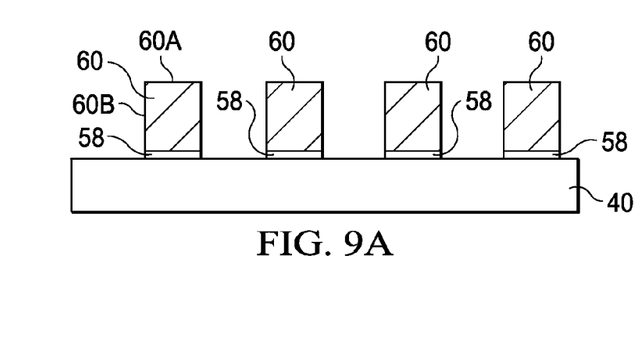
Figure 9B:
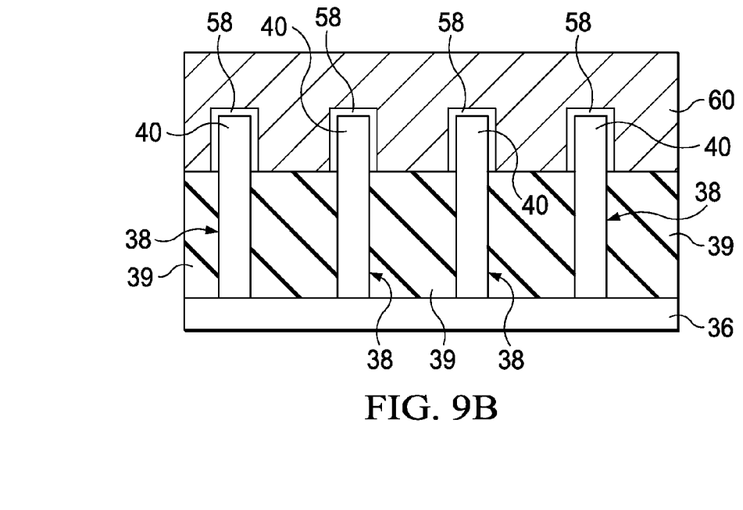

After the wet clean process, the first hard mask layer 48 and the ESL 46 may be removed exposing the top surfaces 60A of the dummy gate electrode 60 (step 216) as illustrated in FIGS. 9A and 9B. The removal of the first hard mask layer 48 and the ESL 46 form the dummy gate electrodes 60 and the dummy gate dielectric layers 58 from the dummy gate electrode layer 44 and dummy gate dielectric layer 42, respectively. The dummy gates electrodes 60 have top surfaces 60A that are substantially parallel to a top surface of the semiconductor fin 40 and sidewalls 60B that are substantially orthogonal to the top surface the semiconductor fin 40. Further, the sidewalls 60B are substantially orthogonal to the top surfaces 60A forming square (right angle) intersections between the sidewalls 60B and the top surfaces 60A.

As illustrated in FIG. 9B, the semiconductor fin 40 is the portion of a semiconductor strip 38 that extends above a top surface of a dielectric layer 39 between the semiconductor strips 38. The dielectric layer 39 may be formed of silicon oxide deposited by a high density plasma, for example, although other dielectric materials formed according to various techniques may also be used.

The patterning and etch steps described above may be performed in an etching chamber. In some embodiments, the etching chamber may be from Lam Research Corp., Applied Materials, Hitachi-Hitech, Tokyo Electron Limited (TEL), or the like. The chamber may have a chiller temperature in a range from 20° C. to about 30° C. and a chamber wall temperature in a range from about 50° C. to about 80° C. The chamber may comprise an electronic static chuck temperature with a four-zone distribution in a range from about 40° C. to about 80° C. However, as one of ordinary skill in the art would understand, any suitable etching chamber vendor or conditions may be used.

The first hard mask layer 48 and the ESL 46 may be removed in a variety of ways. In one embodiment, a plasma dry etch may be used to remove the first hard mask layer 48 and the ESL 46. In another embodiment, this is a multi-step process with the first step involving a chemical mechanical polishing (CMP), in which the first hard mask layer 48 and the ESL 46 are reacted and then ground away using an abrasive. This process may continue until the top surfaces 60A of the dummy gate electrode 60 are exposed. The next step of removing the first hard mask layer 48 and the ESL 46 may be performed by, for example, a wet etch process or a dry etch process.

Figure 10A:
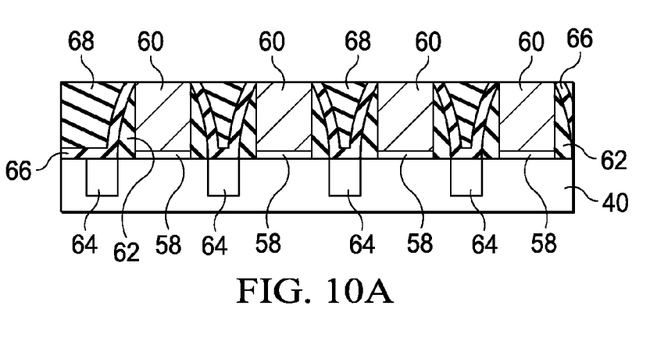
Figure 10B:
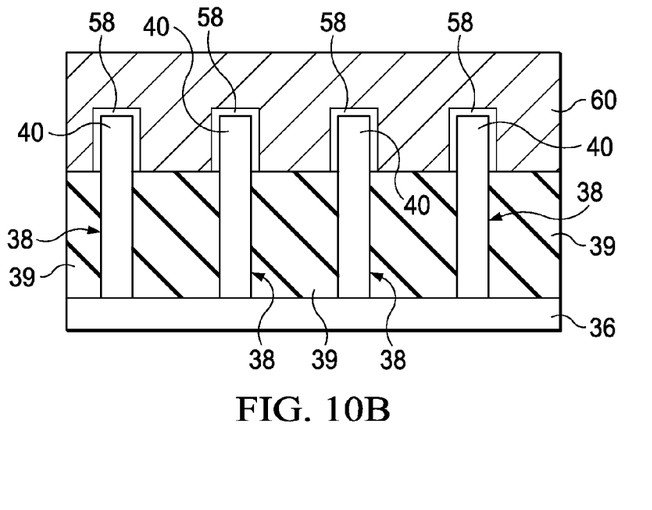

Gate spacers 62 may be formed on opposite sides of the dummy gate electrodes 60 (step 218) as illustrated in FIGS. 10A and 10B. The gate spacers 62 are typically formed by blanket depositing a spacer layer (not shown) on the previously formed structure. In an embodiment, the gate spacers 62 may include a spacer liner (not shown) comprising SiN, SiC, SiGe, oxynitride, oxide, combinations thereof, or the like. The spacer layer may comprise SiN, oxynitride, SiC, SiON, oxide, combinations thereof, or the like and may be formed by methods utilized to form such a layer, such as CVD, plasma enhanced CVD, sputter, and other methods known in the art. The gate spacers 62 are then patterned, for example, by anisotropically etching to remove the spacer layer from the horizontal surfaces of the structure.

Source/drain regions 64 may be formed in the semiconductor fin 40 (step 220). The source/drain regions 64 may be doped by performing an implanting process to implant appropriate dopants to complement the dopants in the semiconductor fin 40. In another embodiment, the source/drain regions 64 may be formed by forming recesses (not shown) in the semiconductor fin 40 and epitaxially growing material in the recesses. The source/drain regions 64 may be doped either through an implantation method as discussed above, or else by in-situ doping as the material is grown.

In another embodiment, the source/drain regions 64 may comprise a lightly doped region and a heavily doped region. In this embodiment, before the gate spacers 62 are formed, the source/drain regions 64 may be lightly doped. After the gate spacers 62 are formed, the source/drain regions 64 may then be heavily doped. This forms lightly doped regions and heavily doped regions. The lightly doped regions are primarily underneath the gate spacers 62 while the heavily doped regions are outside of the gate spacers 62 along the semiconductor fin 40.

After the formation of the source/drain regions 64, an ESL 66 and an interlayer dielectric (ILD) 68 may be formed over the gate spacers 62, the dummy gate electrodes 60, source/drain regions 64 and the semiconductor fin 40 (step 222) as illustrated in FIGS. 10A and 10B. The ESL 66 may be conformally deposited over components on the semiconductor fin 40. In an embodiment, the ESL 66 may comprise SiN, SiCN, SiON, the like, or a combination thereof and may be formed by atomic layer deposition (ALD), molecular layer deposition (MLD), a furnace process, CVD, PECVD, the like, or a combination thereof.

After the ESL 66 is formed, the ILD 68 may be formed over the ESL 66. The ILD 68 may be conformally deposited over the ESL 66. In an embodiment, the ILD 68 may comprise $SiO_2$, SiON, the like, or a combination thereof. The ILD 68 may be formed by CVD, ALD, PECVD, subatmospheric CVD (SACVD), flowable CVD, a high density plasma (HDP), a spin-on-dielectric process, the like, or a combination thereof.

The ILD 68 and the ESL 66 may be planarized to expose top surfaces 60A of the dummy gate electrodes 60. In an embodiment, the ILD 68 and the ESL 66 may be planarized by using a CMP to remove portions of the ILD 68 and the ESL 66. In other embodiments, other planarization techniques may be used, such as etching.

After the ILD 68 and the ESL 66 are planarized to expose top surfaces 60A of the dummy gate electrodes 60, the dummy gate electrodes 60 and the dummy gate dielectric layers 58 may be removed (steps 224 and 226) as illustrated in FIGS. 11A and 11B. The removal of the dummy gate electrodes 60 and the dummy gate dielectric layers 58 may form openings 70 over a channel region in the semiconductor fin 40. The dummy gate electrodes 60 and the dummy gate dielectric layers 58 may be removed by an etch that is selective to the material of the dummy gate electrodes 60 and the dummy gate dielectric layers 58. In an embodiment, the dummy gate electrodes 60 and dummy gate dielectric layers 58 may be removed by an etch comprising $NH_4OH$, tetramethylammonium hydroxide (TMAH), $NF_3$, $SF_6$, $Cl_2$, HBr, the like, or a combination thereof.

After the dummy gate electrodes 60 and dummy gate dielectric layers 58 are removed, gate dielectric layers 80 and gate electrodes 82 are formed (steps 228 and 230) in the openings 70 as illustrated in FIGS. 12A and 12B. The gate dielectric layers 80 and the gate electrodes 82 may be formed of similar materials and by similar processes as the dummy gate dielectric layers 42 and dummy gate electrode layers 44 described in FIG. 2, and are not repeated herein. The semiconductor device may undergo further processing such as formation of contacts to the gates electrodes 82 and the source/drain regions 64.

It has been found that having a vertical sidewall 48B with a height H1 from about 25% to about 50% of the dummy gate electrode height H2 (see FIG. 8) provides an etching margin to produce a dummy gate electrode 60 (see FIG. 9A) with a square top profile. This square top profile of the dummy gate electrode 60 prevents the necessity to over polish the dummy gate electrode to remove ESL residue which may cause a shortened gate height. Further, the square top profile may provide a better structure for end-point detection of the planarization of ILD 68 and the ESL 66.

According to an embodiment, a method of forming a semiconductor device comprises forming a dummy gate electrode layer over a substrate, the dummy gate electrode layer having a first height, forming a first etch stop layer on the dummy gate electrode layer, forming a first hard mask layer on the first etch stop layer, and patterning the first hard mask layer. The method further comprises patterning the first etch stop layer to align with the patterned first hard mask layer, and patterning the gate electrode layer to form a dummy gate electrode, the dummy gate electrode aligning with the patterned first etch stop layer, wherein after the patterning the gate electrode layer the first hard mask layer has a vertical sidewall of a second height, the second height being less than the first height, and the first hard mask layer having a rounded top surface.

According to another embodiment, a method of forming a FinFET device comprises forming a semiconductor fin over a substrate, the semiconductor fin extending from a top surface of the substrate, forming a dummy gate dielectric layer on the semiconductor fin, forming a dummy gate electrode layer on the dummy gate dielectric layer, forming a first hard mask layer over the dummy gate dielectric layer, and patterning the first hard mask layer, the patterned hard mask layer having a top surface parallel to a top surface of the semiconductor fin. The method further comprises patterning the dummy gate electrode layer forming a dummy gate electrode, the dummy gate electrode being coterminous with the patterned hard mask layer, wherein after the patterning the dummy gate electrode, the first hard mask layer has a vertical sidewall having a first height and a rounded top surface, and removing the first hard mask layer to expose a top surface of the dummy gate electrode, the exposed top surface of the dummy gate electrode having a top surface parallel to the top surface of the semiconductor fin.

According to a further embodiment, a method of forming a replacement-gate FinFET device comprises forming a plurality of dummy gate electrodes over a semiconductor fin, the forming the plurality of dummy gate electrodes comprising forming a dummy gate dielectric layer on the semiconductor fin, forming a dummy gate electrode layer on the dummy gate dielectric layer, the dummy gate electrode layer having a first height, patterning a hard mask layer over the dummy gate electrode layer, the patterned hard mask layer having a sidewall of a second height, the second height being from about 25% to about 50% of the first height, the sidewall being orthogonal to a top surface of the semiconductor fin, and patterning the dummy gate electrode and dummy gate dielectric layer, the patterned dummy gate electrode layer aligned with the patterned hard mask layer. The method further comprises forming gate spacers on opposites sides of the plurality of dummy gate electrodes, forming source/drain regions in the semiconductor fin, the source/drain regions being between adjacent pairs of the dummy gate electrodes, and conformally depositing an etch stop layer over the plurality of dummy gate electrodes and respective gate spacers. The method further comprises forming an interlayer dielectric on the etch stop layer, removing the plurality of dummy gate electrodes and the dummy gate dielectric layers, and forming a plurality of active gate electrodes in the openings formed by the removal of the plurality of dummy gate electrodes.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
    forming a dummy gate electrode layer over a substrate, the dummy gate electrode layer having a first height;
    forming a first etch stop layer on the dummy gate electrode layer;
    forming a first hard mask layer on the first etch stop layer;
    patterning the first hard mask layer;
    patterning the first etch stop layer to align with the patterned first hard mask layer; and
    patterning the dummy gate electrode layer to form a dummy gate electrode, the dummy gate electrode aligning with the patterned first etch stop layer, wherein after the patterning the dummy gate electrode layer the first hard mask layer has a vertical sidewall of a second height, the second height being in a range from about 25% to about 50% of the first height.

2. The method of claim 1, wherein the patterning the dummy gate electrode layer further comprises performing a plasma etch at a pressure in a range from about 2 mTorr to about 5 mTorr, at a power in a range from about 300 watts to about 800 watts, with an etching bias in range from about 50 volts to about 150 volts, with a plasma flow including from about 20 sccm to about 200 sccm of HBr, and about 2 sccm to about 10 sccm of $O_2$.

3. The method of claim 1, wherein after the patterning the gate electrode layer the first hard mask layer has a rounded top surface.

4. The method of claim 1, wherein the second height is in a range from about 200 Å to about 400 Å.

5. The method of claim 1 further comprising:
    forming an anti-reflective deposition (ARD) layer over the first hard mask layer;
    forming a second hard mask layer over the ARD layer;
    forming and patterning a photoresist over the second hard mask layer;
    patterning the second hard mask layer to align with the patterned photoresist;
    patterning the ARD layer to align with the patterned second hard mask layer; and
    after the patterning the first etch stop layer, removing the ARD layer.

6. The method of claim 5, wherein the patterning the second hard mask layer further comprises performing a plasma etch at a pressure in a range from about 3 mTorr to about 10 mTorr, at a power in a range from about 300 watts to about 1000 watts, with an etching bias in range from about 50 volts to about 500 volts, with a plasma flow including from about 10 sccm to about 100 sccm of $CF_4$, and about 10 sccm to about 50 sccm of $CH_2F_2$.

7. The method of claim 5, wherein the patterning the ARD layer further comprises performing a plasma etch at a pressure in a range from about 5 mTorr to about 10 mTorr, at a power in a range from about 500 watts to about 1500 watts, with an etching bias in range from about 50 volts to about 400 volts, with a plasma flow including from about 50 sccm to about 200 sccm of $SO_2$, about 50 sccm to about 300 sccm of $O_2$, and about 100 sccm to about 500 sccm of He.

8. The method of claim 5, wherein the removing the ARD layer further comprises a plasma etch at a pressure in a range from about 5 mTorr to about 15 mTorr, at a power in a range from about 300 watts to about 1000 watts, with an etching bias in range from about 40 volts to about 200 volts, with a plasma flow including from about 50 sccm to about 500 sccm of $O_2$.

9. The method of claim 1 further comprising:
    removing the first hard mask layer and the first etch stop layer;
    forming gate spacers on opposite sides of the dummy gate electrode;
    forming source/drain regions in the substrate, the dummy gate electrode being laterally between the source/drain regions;
    removing the dummy gate electrode to expose a channel region in the substrate; and
    forming an active gate over the channel region.

10. The method of claim 1, wherein the substrate comprises a semiconductor fin.

11. A method of forming a FinFET device, the method comprising:
    forming a semiconductor fin over a substrate, the semiconductor fin extending from a top surface of the substrate;
    forming a dummy gate dielectric layer on the semiconductor fin;
    forming a dummy gate electrode layer on the dummy gate dielectric layer;
    forming a first hard mask layer over the dummy gate dielectric layer;
    patterning the first hard mask layer, the patterned first hard mask layer having a top surface parallel to a top surface of the semiconductor fin;
    patterning the dummy gate electrode layer forming a dummy gate electrode, the dummy gate electrode being coterminous with the patterned first hard mask layer, wherein after the patterning the dummy gate electrode, the patterned first hard mask layer having a vertical sidewall of a first height, the first height being in a range from about 25% to about 50% of the height of the dummy gate electrode; and
    removing the patterned first hard mask layer to expose a top surface of the dummy gate electrode, the exposed top surface of the dummy gate electrode having a top surface parallel to the top surface of the semiconductor fin.

12. The method of claim 11, wherein after the removing the first hard mask layer, the dummy gate electrode has a sidewall orthogonal to the top surface of the dummy gate electrode.

13. The method of claim 12, wherein an intersection of the sidewall and top surface of the dummy gate electrode form a right angle.

14. The method of claim 12, wherein the first height is in a range from about 200 Å to about 400 Å.

15. The method of claim 11 further comprising:
   forming gate spacers on opposite sides of the dummy gate electrode;
   forming source/drain regions in the semiconductor fin, the dummy gate electrode being laterally between the source/drain regions;
   conformally depositing an etch stop layer over the gate spacers, the dummy gate electrode, and the semiconductor fin;
   forming an interlayer dielectric on the etch stop layer;
   planarizing the interlayer dielectric and the etch stop layer to expose the top surface of the dummy gate electrode; and
   replacing the dummy gate electrode with an active gate electrode.

16. A method of forming a replacement-gate FinFET device, the method comprising:
   forming a plurality of dummy gate electrodes over a semiconductor fin, the forming the plurality of dummy gate electrodes comprising:
      forming a dummy gate dielectric layer on the semiconductor fin;
      forming a dummy gate electrode layer on the dummy gate dielectric layer, the dummy gate electrode layer having a first height;
      patterning a hard mask layer over the dummy gate electrode layer, the patterned hard mask layer having a sidewall of a second height, the second height being from about 25% to about 50% of the first height, the sidewall being orthogonal to a top surface of the semiconductor fin; and
      patterning the dummy gate electrode and dummy gate dielectric layer, the patterned dummy gate electrode layer aligned with the patterned hard mask layer;
   forming gate spacers on opposites sides of the plurality of dummy gate electrodes;
   forming source/drain regions in the semiconductor fin, the source/drain regions being between adjacent pairs of the dummy gate electrodes;
   conformally depositing an etch stop layer over the plurality of dummy gate electrodes and respective gate spacers;
   forming an interlayer dielectric on the etch stop layer;
   removing the plurality of dummy gate electrodes and the dummy gate dielectric layers; and
   forming a plurality of active gate electrodes in the openings formed by the removal of the plurality of dummy gate electrodes.

17. The method of claim 16, wherein the plurality of dummy gate electrodes have sidewalls orthogonal to the top surface of the semiconductor fin and top surfaces parallel to the top surface of the semiconductor fin.

18. The method of claim 16, wherein the second height is in a range from about 200 Å to about 400 Å.

19. The method of claim 16, wherein the patterning the dummy gate electrode and dummy gate dielectric layer further comprises performing an etch process with an over-etch time from about 10% to about 50%.

20. The method of claim 16, wherein the patterning the dummy gate electrode layer and dummy gate dielectric layer further comprises performing a plasma etch at a pressure in a range from about 2 mTorr to about 5 mTorr, at a power in a range from about 300 watts to about 800 watts, with an etching bias in range from about 50 volts to about 150 volts, with a plasma flow including from about 20 sccm to about 200 sccm of HBr, and about 2 sccm to about 10 sccm of $O_2$.

* * * * *